US010109940B2

United States Patent
Boyd et al.

(10) Patent No.: US 10,109,940 B2
(45) Date of Patent: Oct. 23, 2018

(54) CONNECTOR PORT FRAME FOR PROCESSOR PACKAGE

(71) Applicant: INTEL CORPORATION, Santa Clara, CA (US)

(72) Inventors: Thomas A. Boyd, North Plains, OR (US); Feifei Cheng, Chandler, AZ (US); Donald T. Tran, Phoenix, AZ (US); Russell S. Aoki, Tacoma, WA (US); Karumbu Meyyappan, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/377,254

(22) Filed: Dec. 13, 2016

(65) Prior Publication Data
US 2018/0166807 A1    Jun. 14, 2018

(51) Int. Cl.
  *H01R 12/70*   (2011.01)
  *H01R 12/88*   (2011.01)

(52) U.S. Cl.
  CPC ..... *H01R 12/7076* (2013.01); *H01R 12/7082* (2013.01); *H01R 12/88* (2013.01)

(58) Field of Classification Search
  USPC .......................................................... 439/62
  See application file for complete search history.

(56) References Cited

U.S. PATENT DOCUMENTS

| 7,204,701 B1 | 4/2007 | Balasingham et al. |
| 8,398,410 B2* | 3/2013 | Yeh .................. B82Y 10/00 439/71 |
| 2005/0054230 A1 | 3/2005 | Huang |
| 2005/0208813 A1* | 9/2005 | Trout ................. H01R 13/2442 439/326 |

(Continued)

FOREIGN PATENT DOCUMENTS

| JP | 2009-543296 A | 12/2009 |
| WO | WO2017/171790 A1 | 10/2017 |

OTHER PUBLICATIONS

Intel Corporation, "Connector for Processor Package", International Application No. PCT/US2016/025230, filed Mar. 31, 2016, 54 pages.

(Continued)

*Primary Examiner* — Harshad C Patel
(74) *Attorney, Agent, or Firm* — Schwabe, Williamson & Wyatt, P.C.

(57) ABSTRACT

Embodiments herein relate to port frames and connectors for direct connections to integrated circuit packages. In various embodiments, a port frame to receive a connector and maintain a connection between the connector and a computer processor package may include a protrusion to provide stable attachment of the port frame to a bolster frame, a first wall, a second wall opposite the first wall, a first detent in the first wall, and a second detent in the second wall where the connector is to be received between the first wall and the second wall, and where the first detent is to receive a first (Continued)

locking protrusion extending from the connector and the second detent is to receive a second locking protrusion extending from the connector. Other embodiments may be described and/or claimed.

22 Claims, 10 Drawing Sheets

(56) References Cited

U.S. PATENT DOCUMENTS

| | | | |
|---|---|---|---|
| 2007/0173081 A1* | 7/2007 | Yu | H05K 7/1053 439/73 |
| 2008/0064230 A1* | 3/2008 | Zhang | H05K 7/1053 439/65 |
| 2008/0090428 A1* | 4/2008 | Xing | H05K 7/1061 439/78 |
| 2013/0052852 A1 | 2/2013 | Li et al. | |
| 2015/0364865 A1 | 12/2015 | Sutter et al. | |

OTHER PUBLICATIONS

International Search Report and Written Opinion dated Dec. 20, 2016 for International Application No. PCT/US2016/025230, 12 pages.

* cited by examiner

CONNECTOR PORT FRAME FOR PROCESSOR PACKAGE

FIELD

Embodiments of the present disclosure generally relate to the field of computing and, more particularly, to mounting ports for connectors to integrated circuit packages.

BACKGROUND

In legacy systems for connection of off-board elements to a central processing unit (CPU) package, the connectors for the off-board elements were typically coupled to a circuit board mounted connector. Signals from the off-board elements propagated through electrical traces of the circuit board and/or components mounted to the circuit board prior to reaching the CPU package. The time for the signals to propagate through the electrical traces of the circuit board and/or components mounted to the circuit board became a limiting factor, with the propagation of the signals increasing time needed to process the signals.

BRIEF DESCRIPTION OF THE DRAWINGS

Embodiments of the mounting ports and connectors of the present disclosure may overcome these limitations. The techniques will be readily understood by the following detailed description in conjunction with the accompanying drawings. To facilitate this description, like reference numerals designate like structural elements. Embodiments are illustrated by way of example, and not by way of limitation, in the figures of the accompanying drawings.

DETAILED DESCRIPTION

Embodiments of the present disclosure describe port frames and connectors for direct connection to integrated circuit packages. In various embodiments, a port frame to receive a connector and maintain a connection between the connector and a computer processor package may include a protrusion to provide stable attachment of the port frame to a bolster frame, a first wall, a second wall opposite the first wall, a first detent in the first wall, and a second detent in the second wall where the connector is to be received between the first wall and the second wall, and where the first detent is to receive a first locking protrusion extending from the connector and the second detent is to receive a second locking protrusion extending from the connector.

In the following description, various aspects of the illustrative implementations will be described using terms commonly employed by those skilled in the art to convey the substance of their work to others skilled in the art. However, it will be apparent to those skilled in the art that embodiments of the present disclosure may be practiced with only some of the described aspects. For purposes of explanation, specific numbers, materials, and configurations are set forth in order to provide a thorough understanding of the illustrative implementations. It will be apparent to one skilled in the art that embodiments of the present disclosure may be practiced without the specific details. In other instances, well-known features may be omitted or simplified in order not to obscure the illustrative implementations.

In the following detailed description, reference is made to the accompanying drawings that form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

Figure 1:
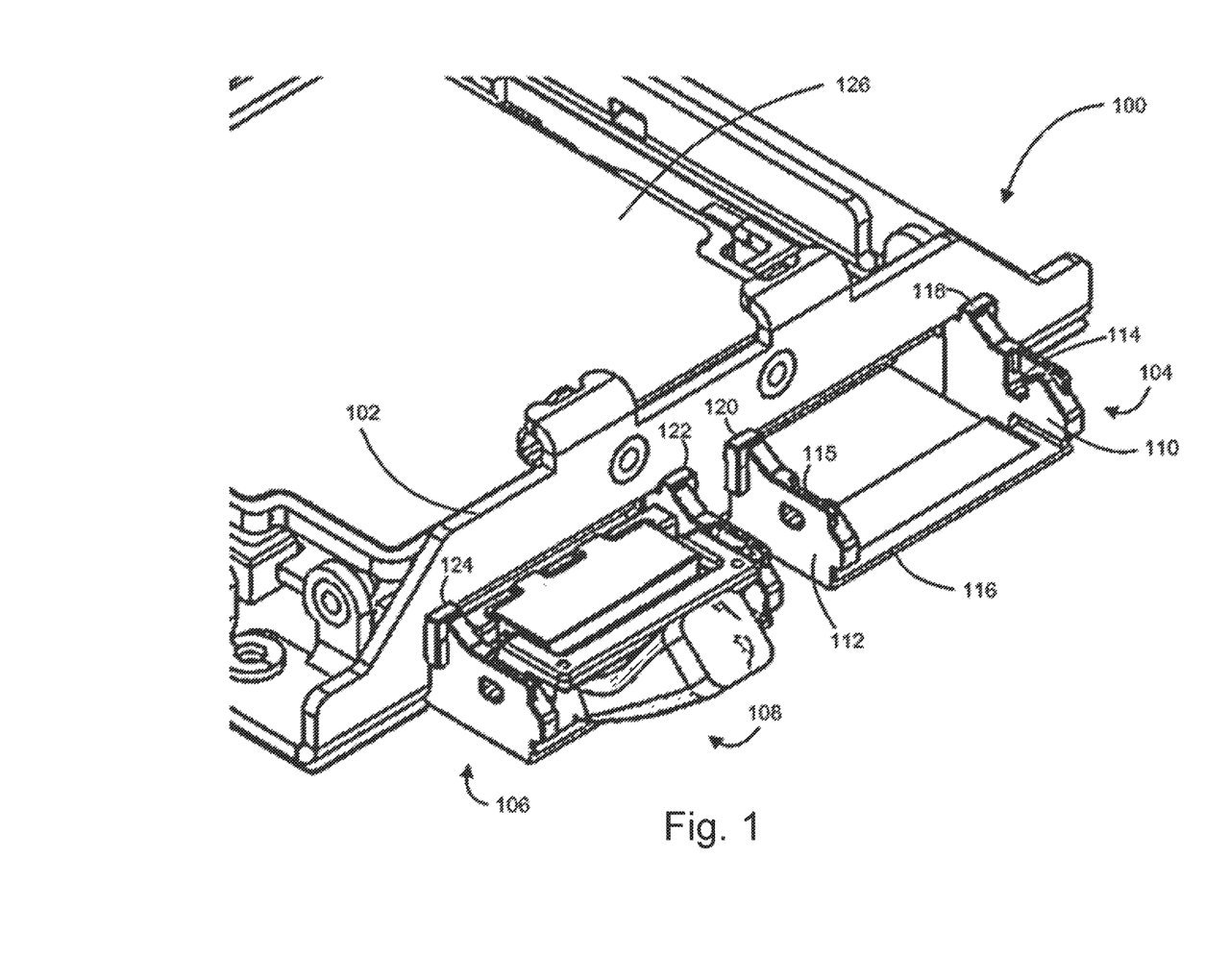
FIG. 1 is a diagram illustrating two port frames coupled with a bolster frame, according to various embodiments.

FIG. 1 is a diagram of a port frame arrangement 100, according to various embodiments. In some embodiments, the port frame arrangement 100 may include a bolster frame 102, a first port frame 104 coupled with the bolster frame 102, and a second port frame 106 coupled with the bolster frame 102. In various embodiments, the bolster frame 102 may be coupled with a circuit board by one or more fasteners or may be affixed to the circuit board by an adhesive and/or with an adhesive layer. In some embodiments, one or more apertures may be formed in a portion of the bolster frame 102, with the first port frame 104 and the second port frame 106 being mounted in the one or more apertures.

In various embodiments, a connector 108 may be removably coupled with the second port frame 106. In some embodiments, a connector (not shown for clarity) may be removably coupled with the first port frame 104. In some embodiments, the first port frame 104 and the second port frame 106 may be identical parts and/or may be used to couple the connector 108 and a second connector with a dual die CPU that may include one or more processors or processor cores. In other embodiments, the port frame arrangement 100 may include a single port frame with the structure of the first port frame 104 to couple a connector with a processor package rather than including two port frames.

In various embodiments, the first port frame 104 may include a first wall 110 and a second wall 112 opposite the first wall 110 with an opening between them to receive a connector. In some embodiments, the first wall 110 may include a first detent 114 and the second wall 112 may include a second detent 115, where the first detent 114 is to receive a first locking protrusion extending from a connector and the second detent 115 is to receive a second locking protrusion extending from the connector. In various embodiments, the first detent 114 may extend only partially through the first wall 110 and the second detent 115 may extend only partially through the second wall 112. In some embodiments, the second port frame 106 may also include a first wall and a second wall, not labeled for clarity, with an opening between them to receive the connector 108. In various embodiments, the first wall of the second port frame 106 may include a first detent, not labeled for clarity, to receive a first locking protrusion extending from the connector 108 and the second wall of the second port frame 106 may include a second detent, not labeled for clarity, to receive a second locking protrusion extending from the connector 108.

In some embodiments, the first port frame 104 may include a crosspiece 116 coupled with the first wall 110 and the second wall 112. In various embodiments, the crosspiece 116 may be between an inserted connector and a system board on which the bolster frame 102 is mounted when the connector is inserted into the first port frame 104. In some embodiments, the first port frame 104 may include a first retention protrusion 118 and a second retention protrusion 120 that may aid in providing a stable coupling of the first port frame 104 with the bolster frame 102. In various embodiments, the second port frame 106 may similarly include a first retention protrusion 122 and a second retention protrusion 124 to provide a stable attachment of the second port frame 106 with the bolster frame 102. In various embodiments, the first port frame 104 may be to couple a connector to be inserted in the first port frame 104 with a processor package 126 that may include one or more processors and the second port frame 106 may be to couple the connector 108, secured by the second port frame 106, with the processor package 126.

Figure 2:
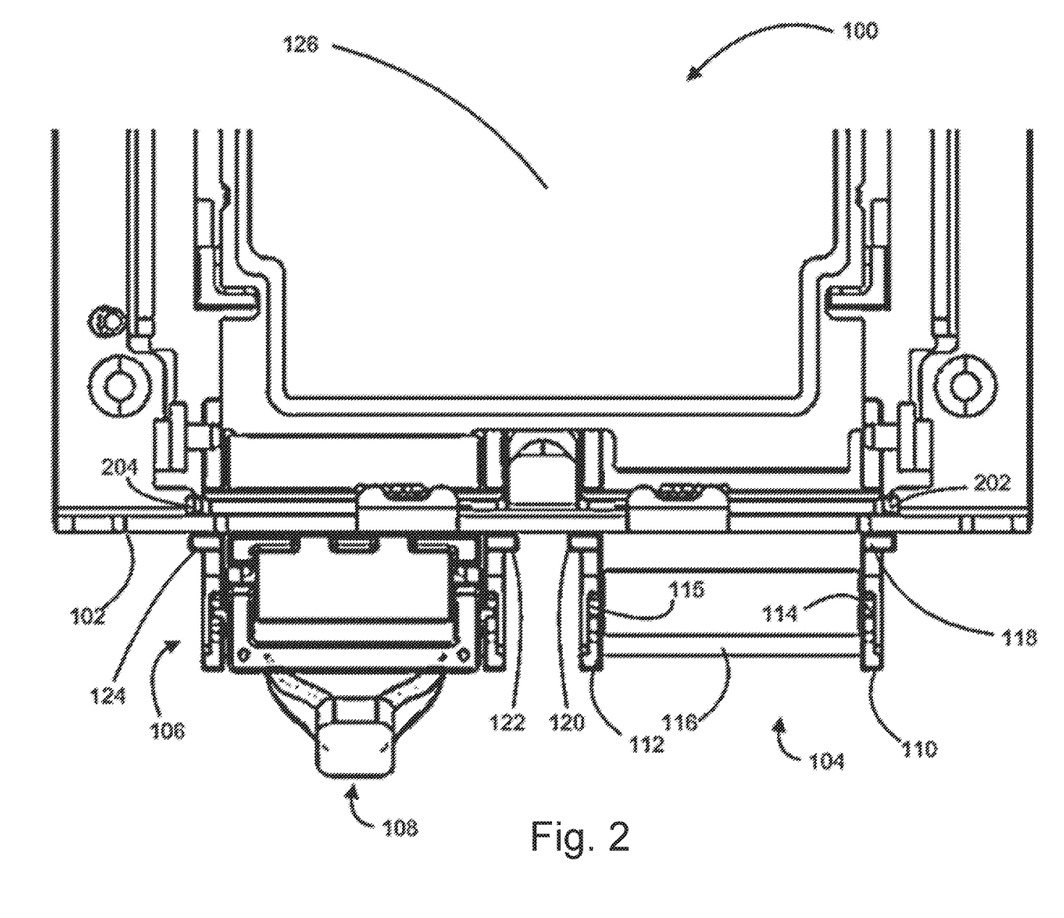
FIG. 2 is a diagram showing a top view of the port frames and bolster frame of FIG. 1, according to various embodiments.

FIG. 2 is a diagram showing a top view of the port frame arrangement 100 of FIG. 1, according to various embodiments. In some embodiments, the first port frame 104 may include one or more retention snaps 202 to retain the first port frame 104 in the bolster frame 102 for handling prior to installation to a board. Similarly, the second port frame 106 may include one or more retention snaps 204 to retain the second port frame 106 in the bolster frame 102 for handling prior to installation to a board in various embodiments.

Figure 3:
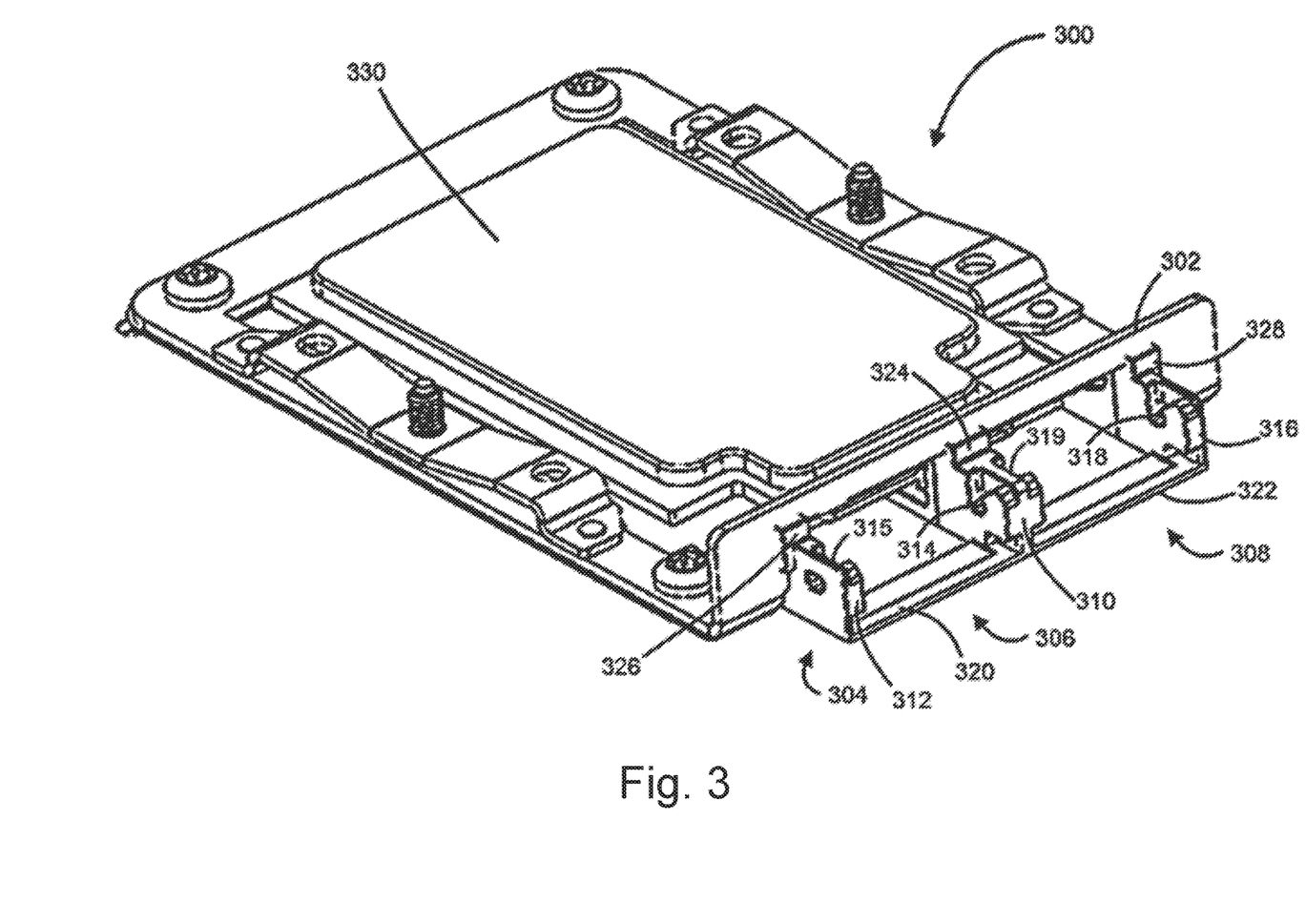
FIG. 3 is a diagram illustrating a dual port frame coupled with a bolster frame, according to various embodiments.

FIG. 3 is a diagram of a dual port frame arrangement 300, according to various embodiments. In some embodiments, the dual port frame arrangement may include a bolster frame 302 and a dual port frame 304 coupled with the bolster frame 302. In various embodiments, the dual port frame 304 may include a first port frame 306 and a second port frame 308 that may have a common wall 310. In some embodiments, the first port frame 306 may include a first detent 314 in a first side of the common wall 310 to receive a first locking protrusion extending from a first connector and a second detent 315 in a wall 312 to receive a second locking protrusion extending from the first connector. In various embodiments, the second port frame 308 may include a first detent 318 in a wall 316 to receive a first locking protrusion extending from a second connector and a second detent 319 in a second side of the common wall 310 to receive a second locking protrusion extending from the second connector.

In some embodiments, a first crosspiece 320 may extend between the common wall 310 and the wall 312 and a second crosspiece 322 may extend between the common wall 310 and the wall 316. In various embodiments, a first retention protrusion 324 may extend from the common wall 310, a second retention protrusion 326 may extend from the wall 312, and a third retention protrusion 328 may extend from the wall 316. In some embodiments, the first retention protrusion 324, the second retention protrusion 326, and the third retention protrusion 328 may be to provide stable attachment of the dual port frame 304 to the bolster frame 302. In various embodiments, the dual port frame 304 may be to couple a first connector in the first port frame 306 and a second connector in the second port frame 308 with a processor package 330 that may include one or more processors.

Figure 4:
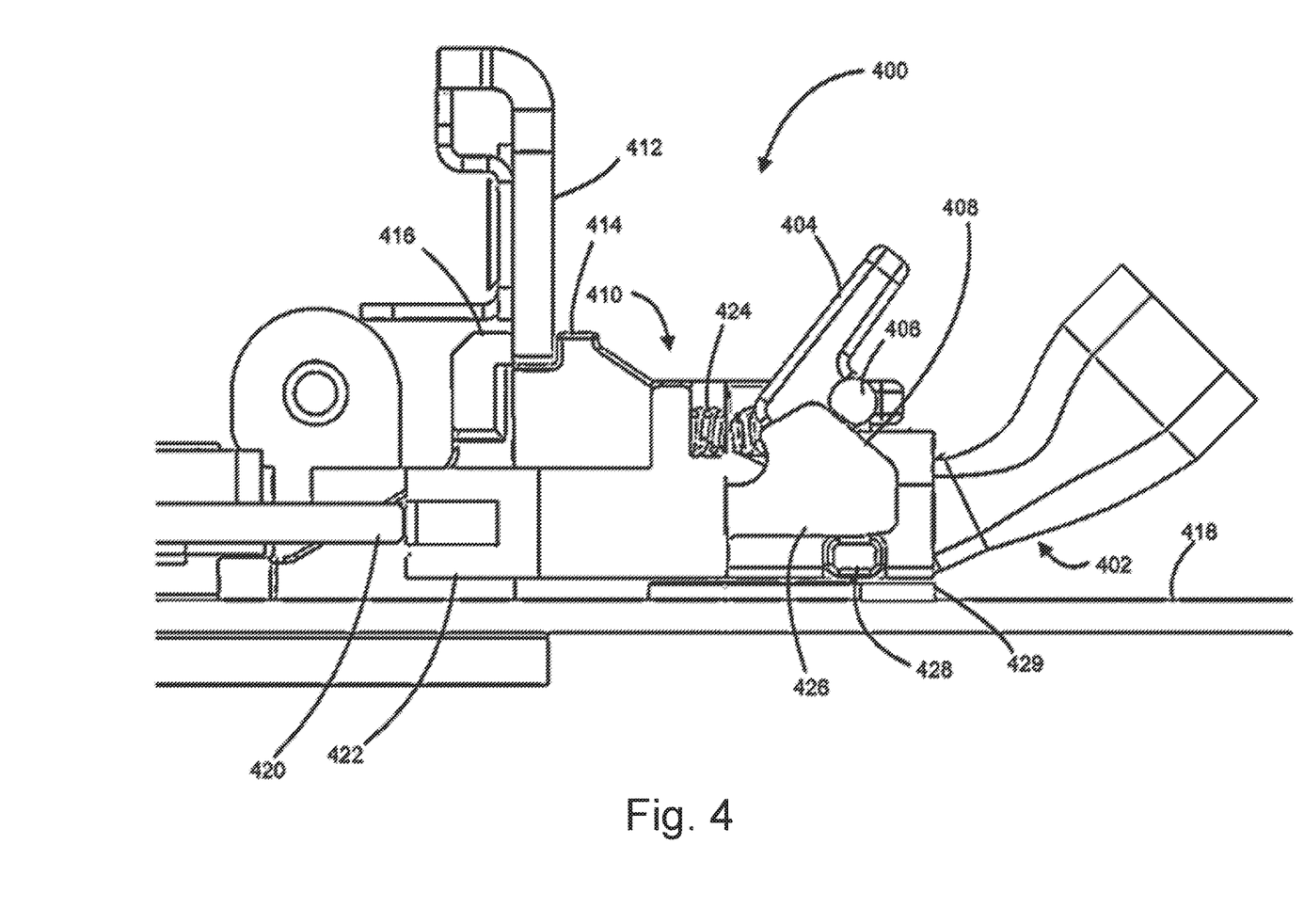
FIG. 4 is a diagram illustrating a cross-sectional view of a latch handle of a connector engaging an insertion ramp of a port frame, according to various embodiments.

FIG. 4 is a diagram illustrating a cross-sectional view of a port frame and connector arrangement 400, in accordance with various embodiments. In some embodiments, a connector 402 may have a latch handle 404 with a locking protrusion 406 that may engage an insertion ramp 408 of a port frame 410 during insertion of the connector 402 into the port frame 410. In various embodiments, the port frame 410 may be structured in a similar fashion to that described with respect to the first port frame 104, the second port frame 106, the first port frame 306, or the second port frame 308. During insertion of the connector 402, in some embodiments, the insertion ramp 408 may engage with the locking protrusion 406 to ensure the latch handle 404 is in an open position for insertion of the connector 402. In some embodiments, the port frame 410 may be coupled with a bolster frame 412. In various embodiments, the port frame 410 may include a retention protrusion 414 to provide stable attachment of the port frame 410 to the bolster frame 412. In various embodiments, the port frame 410 may include a retention protrusion 416 on an opposite side of the bolster frame 412 from the retention protrusion 414 to provide further stability of the attachment of the port frame 410 to the bolster frame 412.

In some embodiments, a processor package having a substrate edge 420 with one or more electrical contacts may be coupled with the board 418. In various embodiments, the processor package may include single or multiple processor cores. In some embodiments, the board 418 may be a system board that may be a component of a computer device or other electronic device that processes data. In various embodiments, the port frame 410 may be positioned proximate the substrate edge 420 such that when the connector 402 is inserted into the port frame 410, an end 422 of the connector 402 couples with the substrate edge 420. In some embodiments, the connector 402 may include one or more electrical contacts. In various embodiments, when the connector 402 is coupled with the substrate edge 420, the electrical contacts of the connector 402 may contact the processor package substrate on a top portion of the processor package, a bottom portion of the processor package, an end of the processor package, or some combination thereof. The portion of the processor package contacted by the electrical contacts of the connector 402 may include one more electrical pads coupled to one or more processors of the processor package, to provide an electrical coupling between the connector 402 and the one or more processors. In various embodiments, one or more wires may enter the connector 402 and also be coupled with the one or more electrical contacts to provide an electrical coupling between the one or more wires and the one or more processors.

In some embodiments, a helical spring 424 in the connector 402 may provide a loading force to keep the connector 402 locked in position when fully inserted. A leaf spring or any other suitable component to provide a spring force may be used instead of the helical spring 424 in other embodiments. In some embodiments, the loading force may minimize signal integrity issues, keep the connector 402 seated against the substrate edge 420, maintain an optimal position of connector contacts to processor lands on the substrate, and/or minimize movement during vibration to eliminate or reduce contact fretting or wear during shipping. In various embodiments, the port frame 410 may be structured to include an overhang having an anti-rock surface 426. In some embodiments, the overhang may form a notch between the overhang and the board 418 to receive a first anti-rock protrusion 428 on the connector 402 that may engage with the anti-rock surface 426 when the connector 402 is inserted into the port frame 410. In various embodiments, the first anti-rock protrusion 428 may engage with the anti-rock surface 426 to limit rotation in a first direction. In some embodiments, the first anti-rock protrusion 428 may limit rotation in an upward direction away from the board 418 in response to a cable coupled with the connector 402 being pulled upward. In various embodiments, limiting rotation may also minimize the impact to signal integrity due to changes in stub lengths affected by an off axis condition. In some embodiments, the connector 402 may include a second anti-rock protrusion 429 that may engage with the board 418 to limit rotation that could hinder installation in a second direction that may be opposite to the first direction. In some embodiments, the port frame 410 and connector 402 may include a second set of one or more components not visible in FIG. 4 (e.g., a second locking protrusion 406, a second helical spring 424, a second insertion ramp 408, a second set of anti-rock protrusions 428 and 429).

Figure 5:
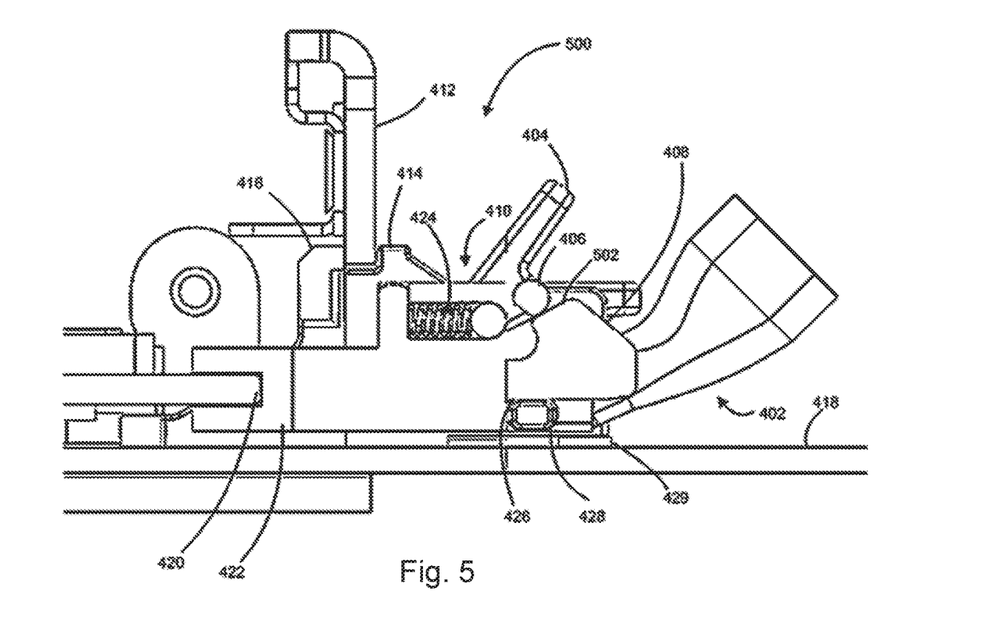
FIG. 5 is a diagram illustrating a latch handle of a connector engaging a load application ramp of a port frame, according to various embodiments.

FIG. 5 is a diagram illustrating a port frame and connector arrangement 500, in accordance with various embodiments. In some embodiments, the port frame and connector arrangement 500 may include the connector 402 with latch handle 404 and/or the port frame 410 described with respect to FIG. 4. The port frame and connector arrangement 500 is shown with the connector 402 inserted into the port frame 410 such that the locking protrusion 406 of the latch handle 404 engages a load application ramp 502 of the port frame 410, according to various embodiments. As shown, in this position, the end 422 of the connector 402 may be coupled with the substrate edge 420 of the processor package in various embodiments. In some embodiments, as an operator depresses the latch handle 404, the load application ramp 502 may compress the helical spring 424 to apply a load against the substrate edge 420. In various embodiments, the port frame 410 may include a second load application ramp on a second wall not visible in FIG. 5.

Figure 6:
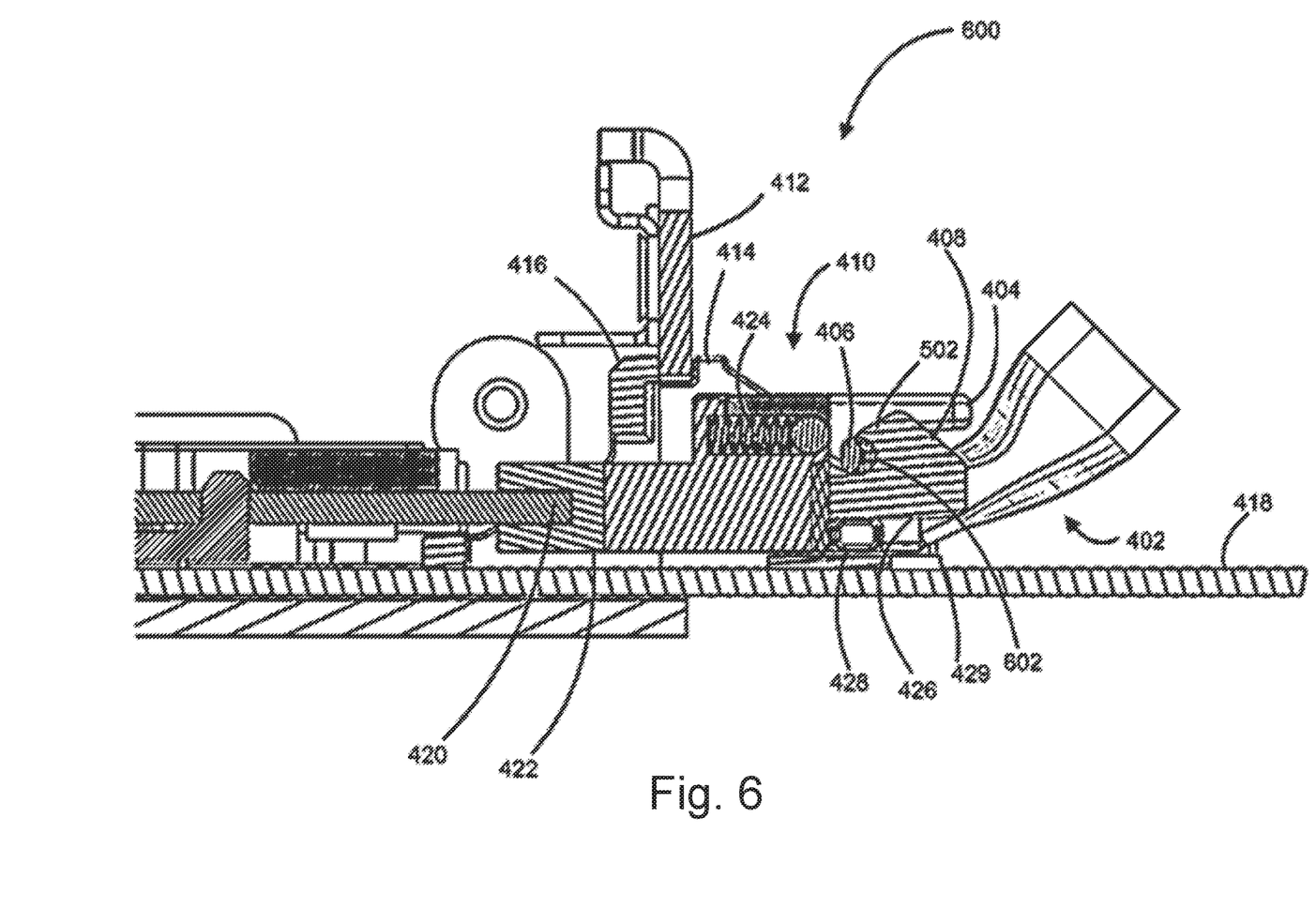
FIG. 6 is a diagram illustrating a latch handle of a connector in a closed and locked position in a port frame, according to various embodiments.

FIG. 6 is a diagram illustrating a port frame and connector arrangement 600, in accordance with various embodiments. In some embodiments, the port frame and connector arrangement 600 may include the connector 402 with latch handle 404 and/or the port frame 410 described with respect to FIG. 4 and FIG. 5. The port frame and connector arrangement 600 is shown with the connector 402 inserted into the port frame 410 after an operator has depressed the latch handle 404 to compress the helical spring 424 and position the locking protrusion 406 of the latch handle 404 to engage a detent 602 of the port frame 410 in a closed and locked position, according to various embodiments. In various embodiments, the detent 602 may extend partially beneath the load application ramp 502. In some embodiments, the locking protrusion 406 may over travel the end of the load application ramp 502 into the detent 602 in response to an operator pressing down on the latch handle 404. As shown, in this position, the end 422 of the connector 402 may continue to be coupled with the substrate edge 420 of the processor package and a spring force from the compressed helical spring 424 may maintain the locking protrusion 406 in the detent 602 to keep the connector 402 in place until an operator releases the latch handle 404, according to some embodiments. In various embodiments, the port frame 410 may include a second detent in a second wall not visible in FIG. 6.

Figure 7:
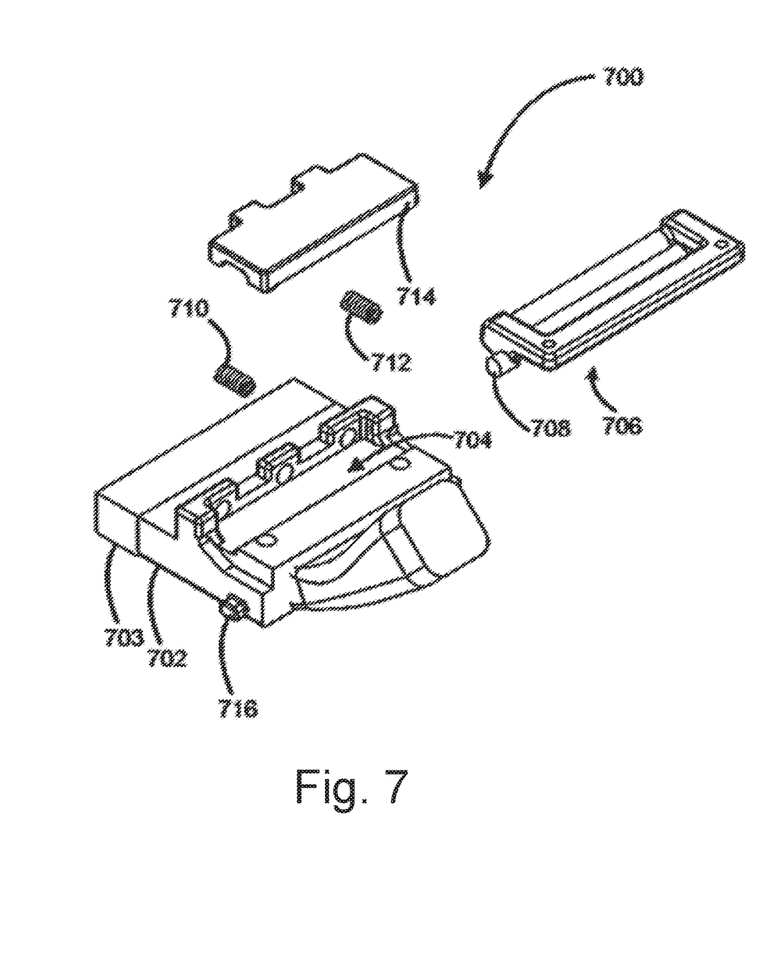
FIG. 7 is a diagram illustrating an exploded view of a connector, according to various embodiments.

FIG. 7 is a diagram illustrating an exploded view of a connector 700, according to various embodiments. In some embodiments, the connector 700 may include a housing 702 that may have an end portion 703 to connect with a substrate edge of a processor package. In various embodiments, the end portion 703 of the housing 702 may be an end cap. In some embodiments, the housing 702 may include a region 704 where a latch handle assembly 706 may be movably coupled with the housing 702. In various embodiments, the latch handle assembly 706 may include a locking protrusion 708. In some embodiments, a first helical spring 710 and a second helical spring 712 may provide spring loading between the latch handle assembly 706 and the housing 702 in a spring loading direction that may be transferred to a port frame, and ultimately substrate edge fingers or other contacts. Leaf springs or any other suitable component to provide a spring force may be used in place of or in addition to the first helical spring 710 and the second helical spring 712 in other embodiments.

In various embodiments, a spring cap 714 may be coupled with the housing 702 to retain the latch handle assembly 706, the first helical spring 710, and the second helical spring 712 and allow the latch handle assembly 706 to travel transversely along a spring loading direction. When assembled, in some embodiments, the first helical spring 710 and the second helical spring 712 may be preloaded to provide a spring force such that the latch handle assembly 706 may be to provide additional compression rather than all compression of the first helical spring 710 and the second helical spring 712. In some embodiments, the housing 702 may include a first anti-rock protrusion 716 to engage with an anti-rock surface of a notch on a port frame when the connector 700 is inserted into the port frame. In various embodiments, the connector 700 may correspond to the connector 108, the connector 402, and/or be structured to fit in and be secured by the first port frame 104, the second port frame 106, the first port frame 306, the second port frame 308, and/or the port frame 410.

Figure 8:
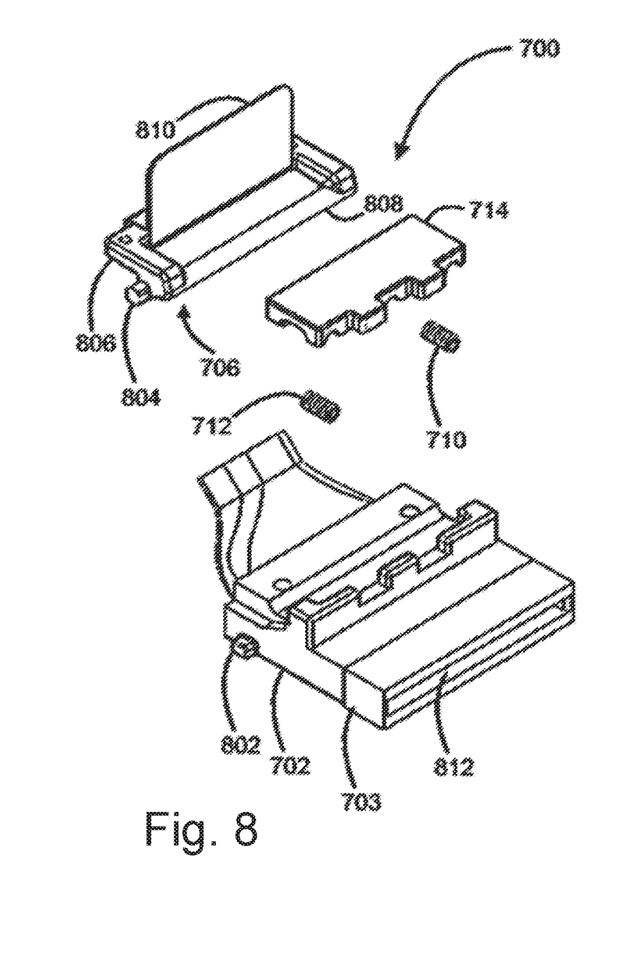
FIG. 8 is a diagram illustrating the connector of FIG. 7 from another angle, according to various embodiments.

FIG. 8 is a diagram illustrating an exploded view of the connector 700 from another angle, according to various embodiments. In some embodiments, the housing 702 may include a second anti-rock protrusion 802 and the latch handle assembly 706 may include a second locking protrusion 804. In various embodiments, the latch handle assembly 706 may include a frame 806 having a crosspiece 808 that may extend across the frame 806 in a direction normal to a spring loading direction. In some embodiments, the frame 806 may be to rotate about a longitudinal axis of the crosspiece 808 as the first locking protrusion 708 moves across a first insertion ramp (e.g., insertion ramp 408) and a first load application ramp (e.g., load application ramp 502) and the second locking protrusion 804 moves across a second insertion ramp and a second load application ramp. In some embodiments, a pull tab 810 may be rotatably coupled with the frame 806 to provide an enhanced grip to an operator to allow the operator to more easily release the first locking protrusion 716 and the second locking protrusion 804 from detents in a port frame when removing the connector 700 from the port frame. In some embodiments, the end portion 703 of the housing 702 may be structured to form a receptacle 812 to receive a substrate edge of a processor package.

Figure 9:
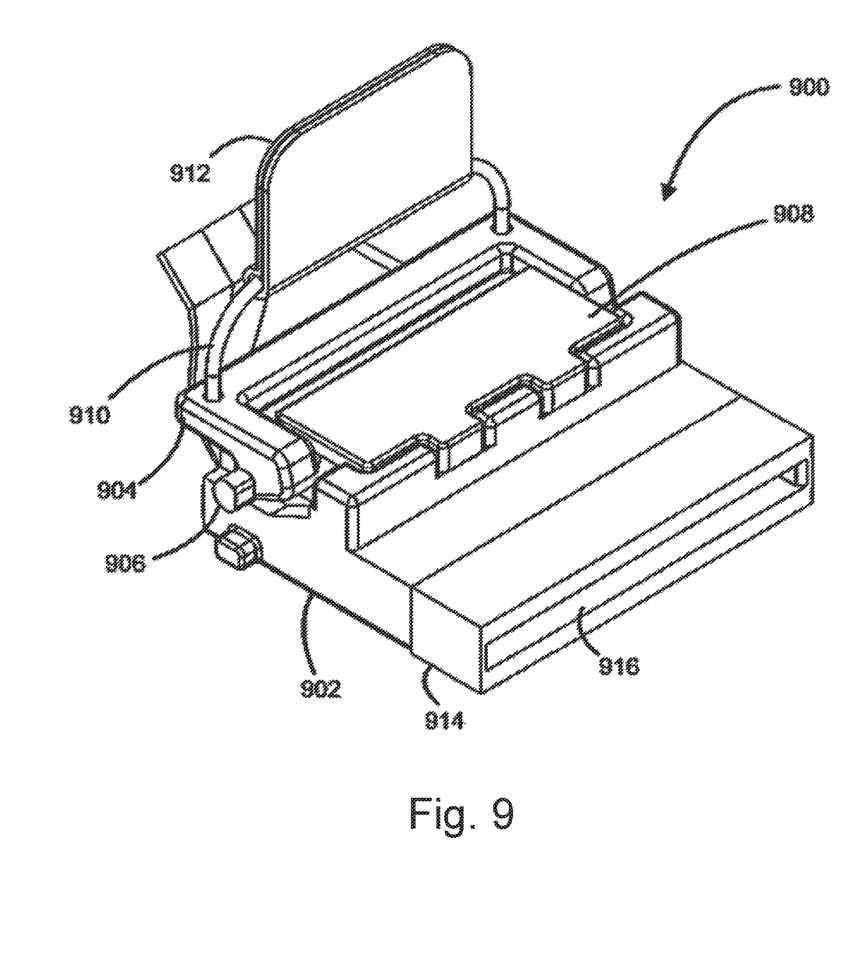
FIG. 9 is a diagram illustrating a connector, according to various embodiments.

FIG. 9 is a diagram illustrating a connector 900, according to various embodiments. In some embodiments, the connector 900 may include a housing 902 and a latch handle 904 having a locking protrusion 906. In various embodiments, a spring cap 908 may be coupled with the housing 902 to retain the latch handle 904 and one or more springs. In some embodiments, a wire 910 may be coupled with the latch handle 906 and a finger grip 912 to allow an operator to more easily release the latch handle when removing the connector 900 from a port frame. In some embodiments, the connector 900 may include some other type of extraction aid (e.g., labels, tapes, monofilament string, or tool access features) rather than the wire 910 and the finger grip 912. In various embodiments, the housing 902 may include an end portion 914 structured to form a receptacle 916 to receive a substrate edge of a processor package. In various embodiments, the connector 900 may correspond to the connector 108, the connector 402, and/or be structured to fit in and be secured by the first port frame 104, the second port frame 106, the first port frame 306, the second port frame 308, and/or the port frame 410.

Figure 10:
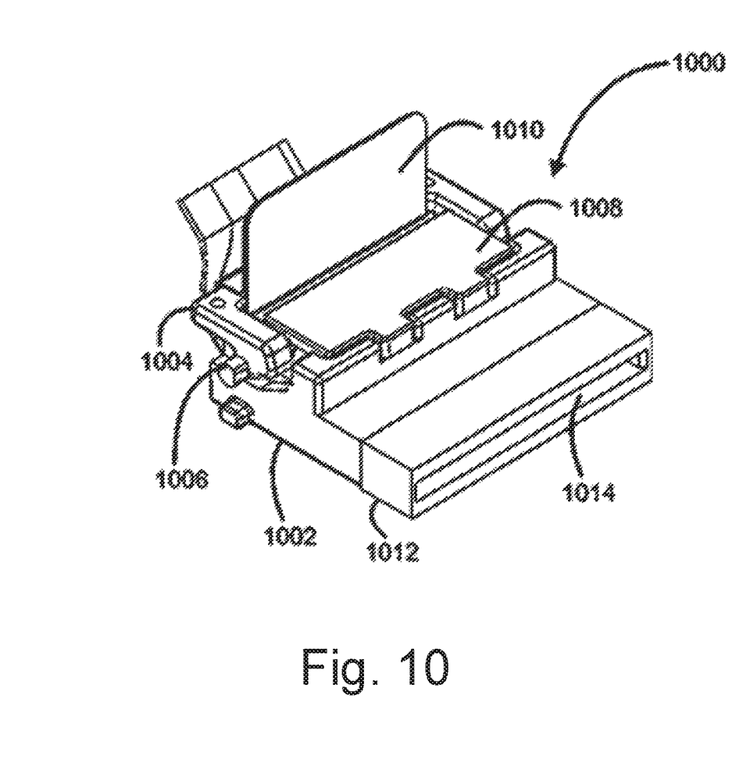
FIG. 10 is a diagram illustrating a connector with a pull tab coupled with a latch handle, according to various embodiments.

FIG. 10 is a diagram illustrating a connector 1000, according to various embodiments. In some embodiments, the connector 1000 may include a housing 1002 and a latch handle 1004 having a locking protrusion 1006. In various embodiments, a spring cap 1008 may be coupled with the housing 1002 to retain the latch handle 1004 and one or more springs. In some embodiments, a pull tab 1010 may be coupled with the latch handle 1004 to provide an enhanced grip to an operator to allow the operator to more easily release the locking protrusion 1006 from a detent in a port frame when removing the connector 1000 from the port frame. In various embodiments, the housing 1002 may include an end portion 1012 structured to form a receptacle 1014 to receive a substrate edge of a processor package.

Figure 11:
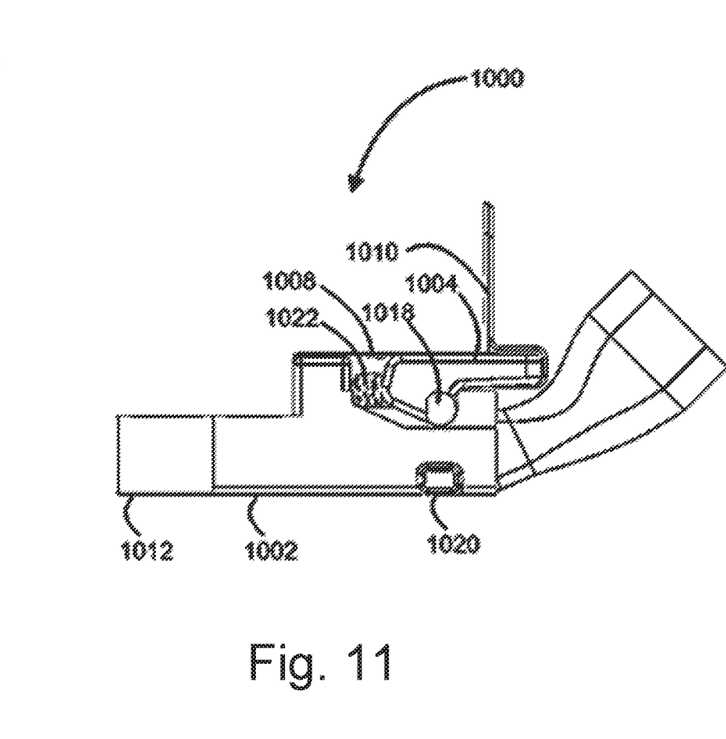
FIG. 11 is a diagram illustrating a side view of the connector of FIG. 10, according to various embodiments.

FIG. 11 is a diagram illustrating a side view of the connector 1000 described with respect to FIG. 10, according to various embodiments. In some embodiments, the latch handle 1004 may include a second locking protrusion 1018 and the connector 1000 may include a second anti-rock protrusion 1020 and a helical spring 1022. In various embodiments, the connector 1000 may correspond to the connector 108, the connector 402, and/or be structured to fit in and be secured by the first port frame 104, the second port frame 106, the first port frame 306, the second port frame 308, and/or the port frame 410.

Figure 12:
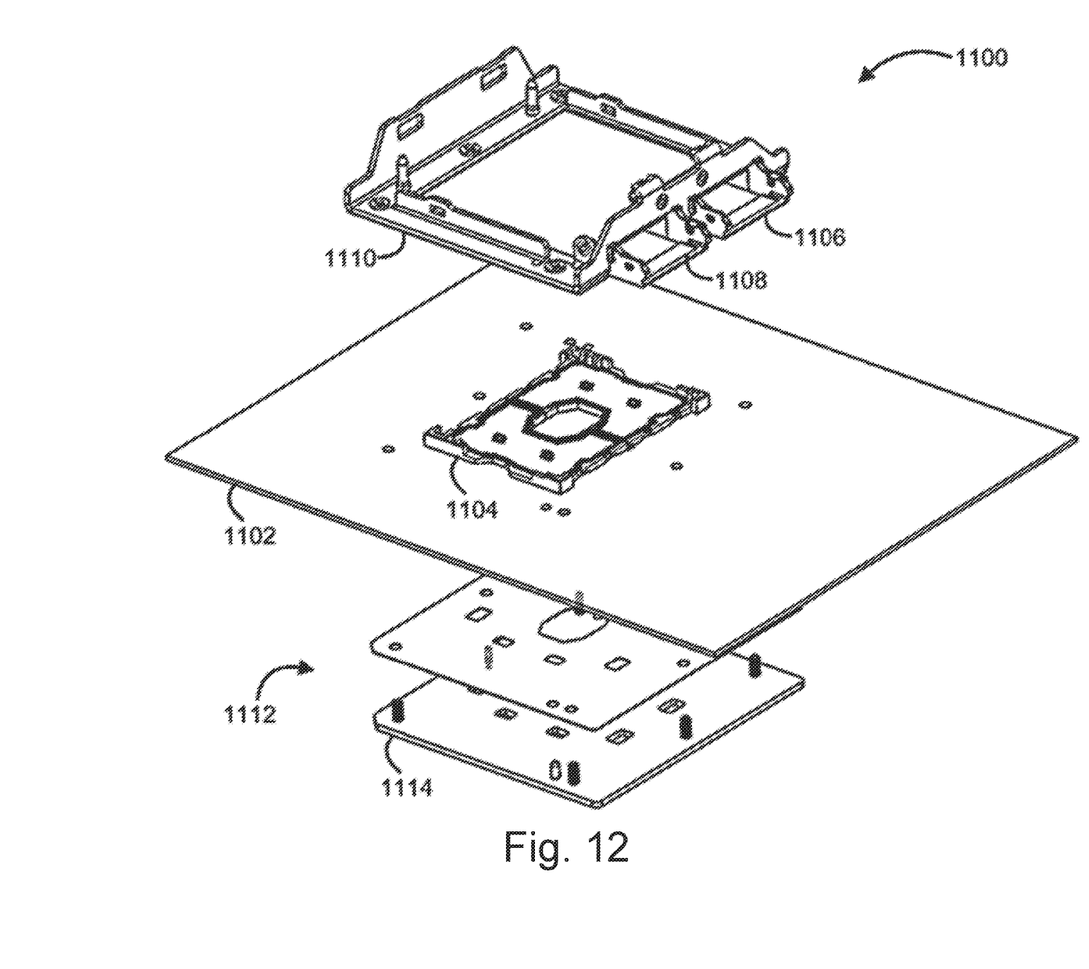
FIG. 12 is a diagram illustrating a circuit board, bolster frame, and port frame assembly, according to various embodiments.

FIG. 12 is a diagram illustrating a circuit board, bolster frame, and port frame assembly 1100, according to various embodiments. In some embodiments, the circuit board, bolster frame, and port frame assembly 1100 may include a circuit board 1102 with a processor socket 1104. In various embodiments, an assembly process may include assembling the circuit board 1102 with all components, including the processor socket 1104, and installing one or more port frames into a bolster assembly. As shown, a first port frame 1106 and a second port frame 1108 may be installed into a bolster frame 1110 in some embodiments. In various embodiments, a backplate assembly 1112 (not all components labeled for clarity), including a backplate 1114, may be installed on a side of the circuit board 1102 opposite that of the bolster frame 1110 and coupled with the bolster frame 1110 through the circuit board 1102. After the circuit board, bolster frame, and port frame assembly 1100 is assembled, a processor may be installed in the socket 1104, a thermal solution may be installed on the processor, and the thermal solution may be loaded to stabilize the processor in the socket in some embodiments. In various embodiments, a first connector may be installed in the first port frame 1106 and a second connector may be installed in the second port frame 1108, with the latch handles of the connectors being closed as described with respect to FIGS. 4-6.

In some embodiments, the circuit board 1102 may correspond to the board 418 and/or the processor socket 1104 may hold a processor in a package (e.g., processor package 126, processor package 330, or a processor package with substrate edge 420). In various embodiments, the bolster frame 1110 may correspond to the bolster frame 102, 302, or 412. In some embodiments, the first port frame 1106 may correspond to the first port frame 104 or the port frame 410 and/or the second port frame 1108 may correspond to the second port frame 106 or the port frame 410. In various embodiments, the connector installed in the first port frame 1106 and/or the second port frame 1108 may correspond to the connector 108, 402, 700, 900, or 1000. In some embodiments, a dual port frame such as the dual port frame 304 may be installed into the bolster frame 1110 rather than the first port frame 1106 and the second port frame 1108.

EXAMPLES

Example 1 may include a port frame to receive a connector and maintain a connection between the connector and a computer processor package, comprising: a protrusion to provide stable attachment of the port frame to a bolster frame associated with the computer processor package; a first wall; a second wall opposite the first wall; a first detent in the first wall; and a second detent in the second wall, wherein the connector is to be received between the first wall and the second wall, and wherein the first detent is to receive a first locking protrusion extending from the connector and the second detent is to receive a second locking protrusion extending from the connector.

Example 2 may include the subject matter of Example 1, wherein the first wall includes a first load application ramp to guide the first locking protrusion to the first detent and apply a load against a substrate as a connector latch handle is depressed and the second wall includes a second load application ramp to guide the second locking protrusion to the second detent and apply the load against the substrate as the connector latch handle is depressed.

Example 3 may include the subject matter of Example 2, wherein the first detent extends partially beneath the first load application ramp and the second detent extends partially beneath the second load application ramp.

Example 4 may include the subject matter of any one of Examples 1-3, wherein the connector includes a latch handle and the first wall includes an insertion ramp to engage with the first locking protrusion during insertion of the connector to cause the latch handle to be in an open position.

Example 5 may include the subject matter of any one of Examples 1-4, further including a crosspiece coupled with the first wall and the second wall, wherein the crosspiece is to be between the connector and a system board when the connector is inserted into the port frame.

Example 6 may include the subject matter of any one of Examples 1-5, further including: a third wall opposite the second wall; a third detent in the second wall, wherein the second detent is on a first side of the second wall and the third detent is on a second side of the second wall; and a fourth detent in the third wall, wherein the connector is a first connector and a second connector is to be received between the second wall and the third wall, and wherein the third detent is to receive a third locking protrusion extending from the second connector and the fourth detent is to receive a fourth locking protrusion extending from the second connector.

Example 7 may include the subject matter of any one of Examples 1-6, wherein the first wall includes a first notch having a first anti-rock surface to engage with a first anti-rock protrusion on the connector, and wherein the second wall includes a second notch having a second anti-rock surface to engage with a second anti-rock protrusion on the connector.

Example 8 may include the subject matter of any one of Examples 1-7, wherein the first detent extends only partially through the first wall and the second detent extends only partially through the second wall.

Example 9 may include a computer system comprising: a system board; a processor package coupled with the system board, wherein the processor package includes a plurality of processor cores and a substrate having an edge with one or more electrical contacts; a bolster frame coupled with the system board; and a port frame coupled with the bolster frame, wherein the port frame includes: a first wall; a second wall opposite the first wall; a first detent in the first wall; and a second detent in the second wall, wherein a connector is to be received between the first wall and the second wall, the first detent is to receive a first locking protrusion extending from the connector and the second detent is to receive a second locking protrusion extending from the connector, and wherein the port frame is to maintain a connection between the connector and the one or more electrical contacts of the substrate edge.

Example 10 may include the subject matter of Example 9, wherein the first wall includes a first load application ramp to guide the first locking protrusion to the first detent and apply a load against a substrate as a connector latch handle is depressed and the second wall includes a second load application ramp to guide the second locking protrusion to the second detent and apply the load against the substrate as the connector latch handle is depressed.

Example 11 may include the subject matter of any one of Examples 9-10, wherein the connector includes a latch handle and the first wall includes an insertion ramp to engage with the first locking protrusion during insertion of the connector to cause the latch handle to be in an open position.

Example 12 may include the subject matter of any one of Examples 9-11, wherein the port frame further includes a crosspiece coupled with the first wall and the second wall, wherein the crosspiece is to be between the connector and a system board when the connector is inserted into the port frame.

Example 13 may include the subject matter of any one of Examples 9-12, wherein the port frame further includes: a third wall opposite the second wall; a third detent in the second wall, wherein the second detent is on a first side of the second wall and the third detent is on a second side of the second wall; and a fourth detent in the third wall, wherein the connector is a first connector and a second connector is to be received between the second wall and the third wall, and wherein the third detent is to receive a third locking protrusion extending from the second connector and the fourth detent is to receive a fourth locking protrusion extending from the second connector.

Example 14 may include the subject matter of any one of Examples 9-13, wherein the first wall includes a first notch having a first anti-rock surface to engage with a first anti-rock protrusion on the connector, and wherein the second wall includes a second notch having a second anti-rock surface to engage with a second anti-rock protrusion on the connector.

Example 15 may include the subject matter of any one of Examples 9-14, wherein the first detent extends only partially through the first wall and the second detent extends only partially through the second wall.

Example 16 may include the subject matter of any one of Examples 9-12, wherein the port frame is a first port frame and the connector is a first connector, the computer processor port frame system further comprising a second port frame coupled with the bolster frame, wherein the second port frame includes: a first wall; a second wall opposite the first wall; a first detent in the first wall; and a second detent in the second wall, wherein a second connector is to be received between the first wall and the second wall of the second port frame, and wherein the second port frame is to maintain a connection between the second connector and one or more electrical contacts of the substrate edge.

Example 17 may include a connector comprising: a housing to connect with a substrate edge of a processor package; a latch handle assembly having a latch handle, a first locking protrusion coupled with the latch handle, and a second locking protrusion coupled with the latch handle; and a spring to provide spring loading between the latch handle assembly and the housing in a spring loading direction, wherein the latch handle assembly is movable in relation to the housing along the spring loading direction, wherein the first locking protrusion is to engage with a first load application ramp of a first wall of a port frame and the second locking protrusion is to engage with a second load application ramp of a second wall of the port frame when the connector is inserted into the port frame and the latch handle is depressed.

Example 18 may include the subject matter of Example 17, wherein the latch handle assembly includes a frame and a finger grip, wherein the first locking protrusion protrudes from the frame, the second locking protrusion protrudes from the frame, and the finger grip is rotatably coupled with the frame.

Example 19 may include the subject matter of Example 18, wherein the frame includes a crosspiece that extends in a direction normal to the spring loading direction, wherein the frame is to rotate about a longitudinal axis of the crosspiece as the first locking protrusion moves across the first load application ramp and the second locking protrusion moves across the second load application ramp.

Example 20 may include the subject matter of any one of Examples 17-19, wherein the spring is a first helical spring and the connector further includes a second helical spring to provide spring loading between the latch handle assembly and the housing in the spring loading direction.

Example 21 may include the subject matter of any one of Examples 17-20, further comprising a spring cap coupled with the housing to retain the spring and the latch handle assembly, wherein the spring cap allows the latch handle assembly to travel transversely along the spring loading direction.

Example 22 may include the subject matter of any one of Examples 17-21, further comprising an anti-rock protrusion on the housing to engage with an anti-rock surface of the port frame.

Example 23 may include the subject matter of Example 22, wherein the anti-rock protrusion is a first anti-rock protrusion to engage with the anti-rock surface of the port frame to limit rotation in a first direction, the connector further including a second anti-rock protrusion to engage with a system board to limit rotation in a second direction opposite to the first direction.

Example 24 may include the subject matter of Example 17, wherein the latch handle assembly includes a frame and a handle, wherein the frame includes a crosspiece that extends in a direction normal to the spring loading direction, wherein the frame is to rotate about a longitudinal axis of the crosspiece as the first locking protrusion moves across a first insertion ramp of the first wall of the port frame and the second locking protrusion moves across a second insertion ramp of the second wall of the port frame.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

Although certain embodiments have been illustrated and described herein for purposes of description, a wide variety of alternate and/or equivalent embodiments or implementations calculated to achieve the same purposes may be substituted for the embodiments shown and described without departing from the scope of the present disclosure. This application is intended to cover any adaptations or variations of the embodiments discussed herein. Therefore, it is manifestly intended that embodiments described herein be limited only by the claims.

Where the disclosure recites "a" or "a first" element or the equivalent thereof, such disclosure includes one or more such elements, neither requiring nor excluding two or more such elements. Further, ordinal indicators (e.g., first, second or third) for identified elements are used to distinguish between the elements, and do not indicate or imply a required or limited number of such elements, nor do they indicate a particular position or order of such elements unless otherwise specifically stated.

What is claimed is:

1. A port frame to receive a connector and maintain a connection between the connector and a computer processor package, the port frame comprising:
   a protrusion to provide stable attachment of the port frame to a bolster frame associated with the computer processor package;
   a first wall;
   a second wall opposite the first wall;
   a first detent in the first wall; and
   a second detent in the second wall, wherein the connector is to be received between the first wall and the second wall, and wherein the first detent is to receive a first locking protrusion extending from the connector and the second detent is to receive a second locking protrusion extending from the connector, wherein the first wall includes a first load application ramp to guide the first locking protrusion to the first detent and apply a load against a substrate as a connector latch handle is depressed and the second wall includes a second load application ramp to guide the second locking protrusion to the second detent and apply the load against the substrate as the connector latch handle is depressed.

2. The port frame of claim 1, wherein the first detent extends partially beneath the first load application ramp and the second detent extends partially beneath the second load application ramp.

3. The port frame of claim 1, wherein the connector includes a latch handle and the first wall includes an insertion ramp to engage with the first locking protrusion during insertion of the connector to cause the latch handle to be in an open position.

4. The port frame of claim 1, further including a crosspiece coupled with the first wall and the second wall, wherein the crosspiece is to be between the connector and a system board when the connector is inserted into the port frame.

5. The port frame of claim 1, further including:
   a third wall opposite the second wall;
   a third detent in the second wall, wherein the second detent is on a first side of the second wall and the third detent is on a second side of the second wall; and
   a fourth detent in the third wall, wherein the connector is a first connector and a second connector is to be received between the second wall and the third wall, and wherein the third detent is to receive a third locking protrusion extending from the second connector and the fourth detent is to receive a fourth locking protrusion extending from the second connector.

6. The port frame of claim 1, wherein the first wall includes a first notch having a first anti-rock surface to engage with a first anti-rock protrusion on the connector, and wherein the second wall includes a second notch having a second anti-rock surface to engage with a second anti-rock protrusion on the connector.

7. The port frame of claim 1, wherein the first detent extends only partially through the first wall and the second detent extends only partially through the second wall.

8. A computer system comprising:
   a system board;
   a processor package coupled with the system board, wherein the processor package includes a plurality of processor cores and a substrate having an edge with one or more electrical contacts;

a bolster frame coupled with the system board, wherein the bolster frame is in contact with the system board; and a port frame coupled with the bolster frame, wherein the port frame includes:
a first wall;
a second wall opposite the first wall;
a first detent in the first wall; and
a second detent in the second wall,
wherein a connector is to be received between the first wall and the second wall, the first detent is to receive a first locking protrusion extending from the connector and the second detent is to receive a second locking protrusion extending from the connector, and wherein the port frame is to maintain a connection between the connector and the one or more electrical contacts of the substrate edge, wherein the first wall includes a first load application ramp to guide the first locking protrusion to the first detent and apply a load against a substrate as a connector latch handle is depressed and the second wall includes a second load application ramp to guide the second locking protrusion to the second detent and apply the load against the substrate as the connector latch handle is depressed.

9. The computer system of claim 8, wherein the connector includes a latch handle and the first wall includes an insertion ramp to engage with the first locking protrusion during insertion of the connector to cause the latch handle to be in an open position.

10. The computer system of claim 8, wherein the port frame further includes a crosspiece coupled with the first wall and the second wall, wherein the crosspiece is to be between the connector and a system board when the connector is inserted into the port frame.

11. The computer system of claim 8, wherein the port frame further includes:
a third wall opposite the second wall;
a third detent in the second wall, wherein the second detent is on a first side of the second wall and the third detent is on a second side of the second wall; and
a fourth detent in the third wall, wherein the connector is a first connector and a second connector is to be received between the second wall and the third wall, and wherein the third detent is to receive a third locking protrusion extending from the second connector and the fourth detent is to receive a fourth locking protrusion extending from the second connector.

12. The computer system of claim 8, wherein the first wall includes a first notch having a first anti-rock surface to engage with a first anti-rock protrusion on the connector, and wherein the second wall includes a second notch having a second anti-rock surface to engage with a second anti-rock protrusion on the connector.

13. The computer system of claim 8, wherein the first detent extends only partially through the first wall and the second detent extends only partially through the second wall.

14. The computer system of claim 8, wherein the port frame is a first port frame and the connector is a first connector, the computer system further comprising a second port frame coupled with the bolster frame, wherein the second port frame includes:
a first wall;
a second wall opposite the first wall;
a first detent in the first wall; and
a second detent in the second wall,
wherein a second connector is to be received between the first wall and the second wall of the second port frame, and wherein the second port frame is to maintain a connection between the second connector and one or more electrical contacts of the substrate edge.

15. A connector comprising:
a housing to connect with a substrate edge of a processor package;
a latch handle assembly having a latch handle, a first locking protrusion coupled with the latch handle, and a second locking protrusion coupled with the latch handle; and
a spring to provide spring loading between the latch handle assembly and the housing in a spring loading direction, wherein the latch handle assembly is movable in relation to the housing along the spring loading direction,
wherein the first locking protrusion is to engage with a first load application ramp of a first wall of a port frame and the second locking protrusion is to engage with a second load application ramp of a second wall of the port frame when the connector is inserted into the port frame and the latch handle is depressed.

16. The connector of claim 15, wherein the latch handle assembly includes a frame and a finger grip, wherein the first locking protrusion protrudes from the frame, the second locking protrusion protrudes from the frame, and the finger grip is rotatably coupled with the frame.

17. The connector of claim 16, wherein the frame includes a crosspiece that extends in a direction normal to the spring loading direction, wherein the frame is to rotate about a longitudinal axis of the crosspiece as the first locking protrusion moves across the first load application ramp and the second locking protrusion moves across the second load application ramp.

18. The connector of claim 15, wherein the spring is a first helical spring and the connector further includes a second helical spring to provide spring loading between the latch handle assembly and the housing in the spring loading direction.

19. The connector of claim 15, further comprising a spring cap coupled with the housing to retain the spring and the latch handle assembly, wherein the spring cap allows the latch handle assembly to travel transversely along the spring loading direction.

20. The connector of claim 15, further comprising an anti-rock protrusion on the housing to engage with an anti-rock surface of the port frame.

21. The connector of claim 20, wherein the anti-rock protrusion is a first anti-rock protrusion to engage with the anti-rock surface of the port frame to limit rotation in a first direction, the connector further including a second anti-rock protrusion to engage with a system board to limit rotation in a second direction opposite to the first direction.

22. The connector of claim 15, wherein the latch handle assembly includes a frame and a handle, wherein the frame includes a crosspiece that extends in a direction normal to the spring loading direction, wherein the frame is to rotate about a longitudinal axis of the crosspiece as the first locking protrusion moves across a first insertion ramp of the first wall of the port frame and the second locking protrusion moves across a second insertion ramp of the second wall of the port frame.

* * * * *